United States Patent
Lim et al.

(10) Patent No.: US 8,054,087 B2
(45) Date of Patent: Nov. 8, 2011

(54) LOW-POWER DIRECT CURRENT DETECTOR

(75) Inventors: Joon Hyung Lim, Gyunggi-Do (KR); Tah Joon Park, Gyunggi-Do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 484 days.

(21) Appl. No.: 12/274,122

(22) Filed: Nov. 19, 2008

(65) Prior Publication Data

US 2010/0033162 A1 Feb. 11, 2010

(30) Foreign Application Priority Data

Aug. 8, 2008 (KR) .................. 10-2008-0078011

(51) Int. Cl.
*G01R 27/02* (2006.01)
(52) U.S. Cl. .................. 324/611; 324/600; 324/606

(58) Field of Classification Search .................. None
See application file for complete search history.

(56) References Cited

U.S. PATENT DOCUMENTS 6,124,760 A 9/2000 Hong
7,336,085 B2 * 2/2008 Fabbro et al. .................. 324/713
7,446,554 B2 * 11/2008 Kodera ....................... 324/750.3

* cited by examiner

*Primary Examiner* — Huy Phan
*Assistant Examiner* — Trung Nguyen
(74) *Attorney, Agent, or Firm* — Lowe, Hauptman, Ham & Berner, LLP

(57) ABSTRACT

Provided is a low-power direct current detector. The low-power direct current detector includes a main current source circuit generating an ultra-low current, a limitation circuit limiting the current generated by the main current source circuit to lower than a preset current, and a voltage detection circuit biased by the ultra-low current generated by the main current source circuit to detect an input DC voltage.

20 Claims, 2 Drawing Sheets

LOW-POWER DIRECT CURRENT DETECTOR

CROSS-REFERENCE TO RELATED APPLICATIONS

This application claims the priority of Korean Patent Application No. 2008-78011 filed on Aug. 8, 2008, in the Korean Intellectual Property Office, the disclosure of which is incorporated herein by reference.

BACKGROUND OF THE INVENTION

1. Field of the Invention

The present invention relates to a low-power direct current (DC) detector applicable to a wake-up receiver, and more particularly, to a low-power DC detector which generates an ultra-low current and uses it as a bias current, whereby the DC detector can detect a wake-up voltage of a low DC component and has low current consumption.

2. Description of the Related Art

Generally, one of the most essential functions in the current wireless communication is to use a single dry cell of ultra-low power for more than several years. To this end, wireless systems must be able to determine whether to perform the wake-up operation by using an ultra-low current consumption (several μA) or keep a deep sleep state.

Meanwhile, the low-power wake-up operation requires a rectification technology for rectifying an RF signal with ultra-low current consumption, and a detection technology for detecting a rectified DC signal with ultra-low current.

According to the related art DC detection structure, the rectified DC voltage is compared with the preset reference voltage, and a wake-up interrupt signal for wake-up is generated when the rectified voltage is higher than the reference voltage.

However, the related art DC detector must generate the reference voltage for comparison with the rectified voltage, additional circuits and costs are required. Furthermore, when a resistor division circuit for generating the reference voltage is used, current consumption increases in the resistor division.

SUMMARY OF THE INVENTION

An aspect of the present invention provides a low-power DC detector which generates an ultra-low current and uses it as a bias current, whereby the DC detector can detect a wake-up voltage of a low DC component and has low current consumption.

According to an aspect of the present invention, there is provided a low-power direct current (DC) detector, including: a main current source circuit generating an ultra-low current; a limitation circuit limiting the current generated by the main current source circuit to lower than a preset current; and a voltage detection circuit biased by the ultra-low current generated by the main current source circuit to detect an input DC voltage.

The low-power DC detector may further include: a driving circuit supplying an operating voltage when a power supply voltage is higher than a preset voltage; and an ultra-low current source circuit biased by the operating voltage supplied by the driving circuit and generating the ultra-low current limited to lower than the preset current by the limitation circuit to form a current mirror connection with the main current source circuit.

The ultra-low current source circuit may include: a first current mirror biased by the operating voltage supplied by the driving circuit to generate the ultra-low current limited to lower than the preset current by the limitation circuit; and a second current mirror mirroring the ultra-low current generated by the first current mirror to the main current source circuit.

The main current source circuit may include: a first mirror unit forming a current mirror connection with the second current mirror; a current mirror unit generating the ultra-low current determined by the first mirror unit; and a second mirror unit forming a current mirror connection with the current mirror unit to supply the ultra-low current generated by the current mirror unit to the voltage detection circuit as a bias current.

The voltage detection circuit may include: a DC voltage detection unit biased by the bias current generated by the main current source circuit to detect the input DC voltage; and a signal output unit buffering the voltage detected by the DC voltage detection unit to an output terminal.

The first current mirror may include: a first PMOS transistor having a source connected to a power supply voltage terminal; and a second PMOS transistor having a source connected to the power supply voltage terminal, and a gate and a drain connected to a gate of the first PMOS transistor.

The first current mirror unit may further include: a third PMOS transistor having a source connected to a drain of the first PMOS transistor, and a drain connected to the second current mirror; and a fourth PMOS transistor having a source connected to the drain of the second PMOS transistor, and a gate and a drain connected to the gate of the second PMOS transistor.

The second current mirror may include: a first NMOS transistor having a drain and a gate connected to the drain of the third PMOS transistor; and a second NMOS transistor having a drain connected to the drain of the fourth PMOS transistor, and a gate connected to the gate and the drain of the first NMOS transistor.

The second current mirror may further include: a third NMOS transistor having a drain and a gate connected to a source of the first NMOS transistor, and a source connected to a ground terminal; and a fourth NMOS transistor having a drain connected to a source of the second NMOS transistor, a gate connected to the gate of the third NMOS transistor, and a source connected to the limitation circuit.

The first mirror unit may include: a fifth NMOS transistor having a gate connected to the gate of the second NMOS transistor, and a drain connected to the current mirror unit; and a sixth NMOS transistor having a gate connected to the gate of the fifth NMOS transistor, and a drain connected to the current mirror unit.

The first mirror unit may further include: a seventh NMOS transistor having a gate connected to the gate of the fourth NMOS transistor, a drain connected to a source of the fifth NMOS transistor, and a source connected to the limitation circuit; and an eighth NMOS transistor having a gate connected to the gate of the seventh NMOS transistor, a drain connected to the source of the sixth NMOS transistor, and a source connected to the limitation circuit.

The imitation circuit may include a resistor connected between a common connection node of the sources of the fourth, seventh and eighth NMOS transistors and the ground terminal.

The resistor of the limitation circuit may be a variable resistor.

The current mirror unit may include: a fifth PMOS transistor having a source connected to the power supply voltage terminal; a sixth PMOS transistor having a source connected to the power supply voltage terminal, and a gate connected to a gate and a drain of the fifth PMOS transistor; a seventh PMOS transistor having a source connected to the drain and the gate of the fifth PMOS transistor, and a drain and a gate connected to the drain of the fifth NMOS transistor; and an eighth PMOS transistor having a source connected to the drain of the sixth PMOS transistor, a gate connected to the drain and the gate of the seventh NMOS transistor, and a drain connected to the drain of the sixth NMOS transistor.

The second mirror unit may include: a first mirror circuit including first to third driving PMOS transistors having gates connected to the gate of the sixth NMOS transistor, and sources connected to the power supply voltage terminal; and a second mirror circuit including fourth to sixth driving PMOS transistors having gates connected to the gate of the eighth NMOS transistor, and sources respectively connected to the drains of the first to third driving PMOS transistors.

The DC voltage detection unit may include: a first detection NMOS transistor having a gate connected to an input terminal to receive the DC voltage, a drain connected to a drain of the fourth driving transistor, and a source connected to the ground terminal; and a second detection NMOS transistor having a drain connected to a drain of the fifth driving transistor, a gate connected to the drain of the first detection NMOS transistor, and a source connected to the ground terminal.

The signal output unit may include a first inverter receiving a driving current through a drain of the sixth driving PMOS transistor and inverting a signal input through the drain of the second detection NMOS transistor.

The signal output unit may further include a second inverter receiving the power supply voltage and inverting a signal output from the first inverter.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
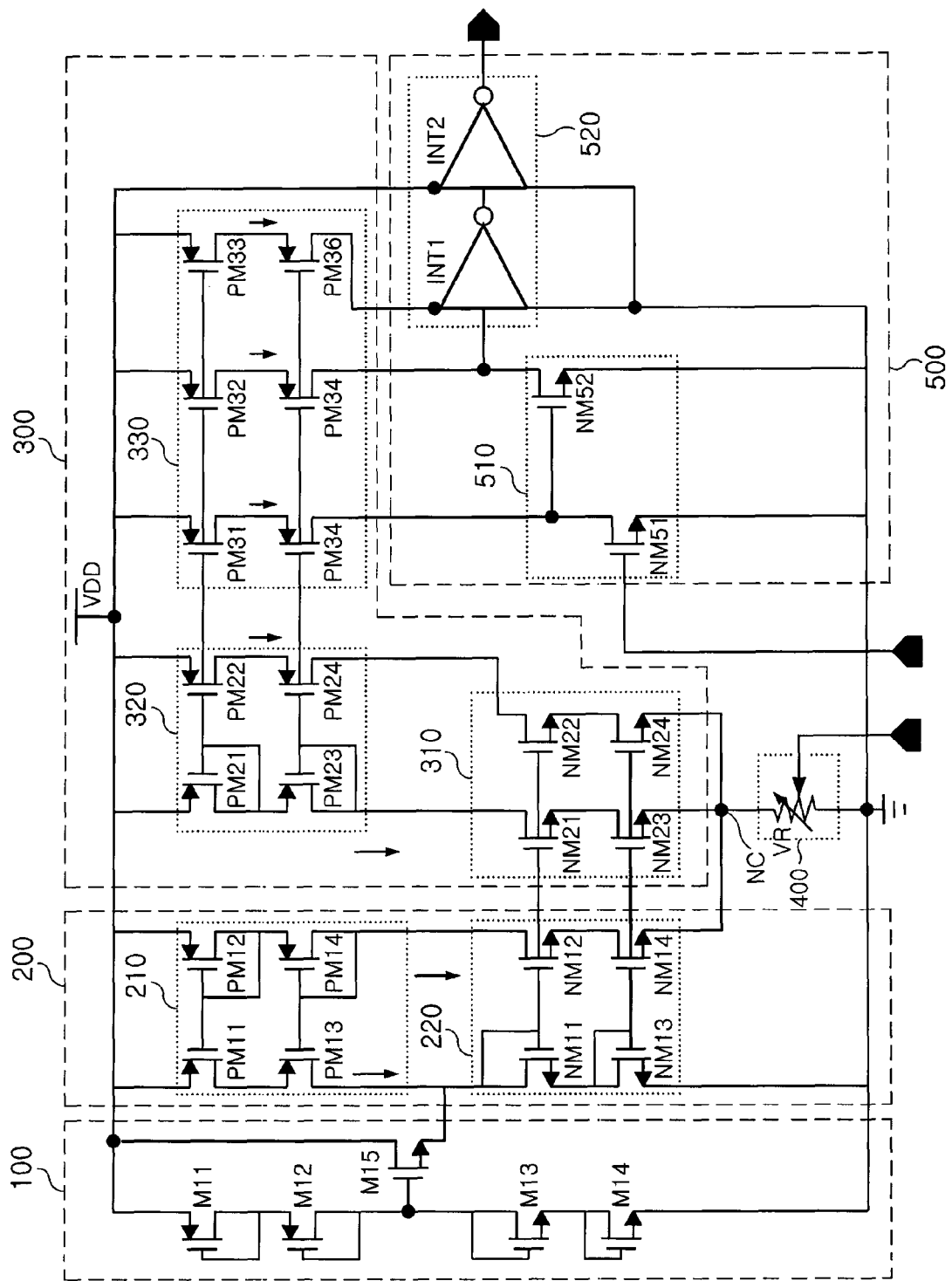
FIG. 1 is a block diagram of a low-power DC detector according to an embodiment of the present invention.

Exemplary embodiments of the present invention will now be described in detail with reference to the accompanying drawings.

The present invention should not be construed as being limited to the embodiments set forth herein; rather, these embodiments are provided so that this disclosure will be thorough and complete, and will fully convey the concept of the invention to those skilled in the art. Like reference numerals in the drawings denote like elements.

FIG. 1 is a block diagram of a low-power DC detector according to an embodiment of the present invention.

Referring to FIG. 1, the low-power DC detector according to the embodiment of the present invention includes a main current source circuit 300 generating an ultra-low current, a limitation circuit 400 limiting the current generated by the main current source circuit 300 to lower than a preset current, and a voltage detection circuit 500 biased by the ultra-low current generated by the main current source circuit 300 to detect an input DC voltage.

In addition, the low-power DC detector may further include a driving circuit 100 supplying an operating voltage when a power supply voltage VDD is higher than a preset voltage, and an ultra-low current source circuit 200 biased by the operating voltage supplied by the driving circuit 100 and generating an ultra-low current limited to lower than the preset current by the limitation circuit 400 to form a current mirror connection with the main current source circuit 300.

The ultra-low current source circuit 200 includes a first current mirror 210 biased by the operating voltage supplied by the driving circuit 100 to generate the ultra-low current limited to lower than the preset current by the limitation circuit 400, a second current mirror 220 mirroring the ultra-low current generated by the first current mirror 210 to the main current source circuit 300.

The main current source circuit 300 includes a first mirror unit 310 forming a current mirror connection with the second current mirror 220, a current mirror unit 320 generating the ultra-low current determined by the first mirror unit 310, and a second mirror unit 330 forming a current mirror connection with the current mirror unit 320 to supply the ultra-low current generated by the current mirror unit 320 to the voltage detection circuit 500 as the bias current.

The voltage detection circuit 500 includes a DC voltage detection unit 510 biased by the bias current generated by the main current source circuit 300 to detect the input DC voltage, and a signal output unit 520 buffering the voltage detected by the DC voltage detection unit 510 to an output terminal.

The first current mirror 210 may include: a first PMOS transistor PM11 having a source connected to a power supply voltage (VDD) terminal; a second PMOS transistor PM12 having a source connected to the power supply voltage (VDD) terminal, and a gate and a drain connected to a gate of the first PMOS transistor PM11; a third PMOS transistor PM13 having a source connected to a drain of the first PMOS transistor PM11, and a drain connected to the second current mirror 220; and a fourth PMOS transistor PM14 having a source connected to the drain of the second PMOS transistor PM12, and a gate and a drain connected to the gate of the second PMOS transistor PM12.

The second current mirror 220 may include: a first NMOS transistor NM11 having a drain and a gate connected to the drain of the third PMOS transistor PM13; a second NMOS transistor NM12 having a drain connected to the drain of the fourth PMOS transistor PM14, and a gate connected to the gate and the drain of the first NMOS transistor NM11; a third NMOS transistor NM13 having a drain and a gate connected to a source of the first NMOS transistor NM11, and a source connected to a ground terminal; and a fourth NMOS transistor NM14 having a drain connected to a source of the second NMOS transistor NM12, a gate connected to the gate of the third NMOS transistor NM13, and a source connected to the limitation circuit 400.

The first mirror unit 310 may include: a fifth NMOS transistor NM21 having a gate connected to the gate of the second NMOS transistor NM12, and a drain connected to the current mirror unit 320; a sixth NMOS transistor NM22 having a gate connected to the gate of the fifth NMOS transistor NM21, and a drain connected to the current mirror unit 320; a seventh NMOS transistor NM23 having a gate connected to the gate of the fourth NMOS transistor NM14, a drain connected to a source of the fifth NMOS transistor NM21, and a source connected to the limitation circuit 400; and an eighth NMOS transistor NM24 having a gate connected to the gate of the seventh NMOS transistor NM23, a drain connected to the source of the sixth NMOS transistor NM22, and a source connected to the limitation circuit 400.

The limitation circuit 400 includes a resistor VR connected between a common connection node NC of the sources of the fourth, seventh and eighth NMOS transistors NM14, NM23 and NM24 and the ground terminal. In this case, the resistor VR of the limitation circuit 400 may be implemented with a variable resistor.

The current mirror unit 320 may include: a fifth PMOS transistor PM21 having a source connected to the power supply voltage (VDD) terminal; a sixth PMOS transistor PM22 having a source connected to the power supply voltage (VDD) terminal, and a gate connected to a gate and a drain of the fifth PMOS transistor PM21; a seventh PMOS transistor PM23 having a source connected to the drain and the gate of the fifth PMOS transistor PM21, and a drain and a gate connected to the drain of the fifth NMOS transistor NM21; and an eighth PMOS transistor PM24 having a source connected to the drain of the sixth PMOS transistor PM22, a gate connected to the drain and the gate of the seventh NMOS transistor NM23, and a drain connected to the drain of the sixth NMOS transistor NM22.

The second mirror unit 330 may include a first mirror circuit and a second mirror circuit. The first mirror circuit includes first to third driving PMOS transistors PM31 to PM33 having gates connected to the gate of the sixth NMOS transistor NM22, and sources connected to the power supply voltage (VDD) terminal. The second mirror circuit includes fourth to sixth driving PMOS transistors PM34 to PM36 having gates connected to the gate of the eighth NMOS transistor NM24, and sources respectively connected to the drains of the first to third driving PMOS transistors PM31 to PM33.

The DC voltage detection unit 510 may include: a first detection NMOS transistor NM51 having a gate connected to an input terminal to receive the DC voltage, a drain connected to a drain of the fourth driving transistor PM34, and a source connected to the ground terminal; and a second detection NMOS transistor NM52 having a drain connected to a drain of the fifth driving transistor PM35, a gate connected to the drain of the first detection NMOS transistor NM51, and a source connected to the ground terminal.

The signal output unit 520 may include: a first inverter INT1 receiving a driving current through a drain of the sixth driving PMOS transistor PM36 and inverting a signal input through the drain of the second detection NMOS transistor NM52; and a second inverter INV2 receiving the power supply voltage VDD and inverting a signal output from the first inverter INT1.

Figure 2:
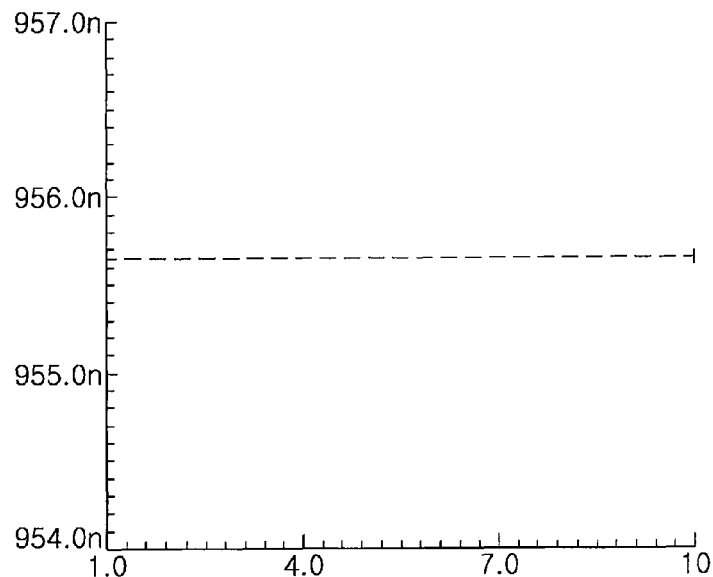
FIG. 2 is a graph illustrating power consumption in the DC detector according to the embodiment of the present invention.

FIG. 2 is a graph illustrating the current consumption of the DC detector according to an embodiment of the present invention. It can be seen from FIG. 2 that the current consumption is about 955.6 nA and the DC detector can operate with an ultra-low current less than 1 μA.

Figure 3:
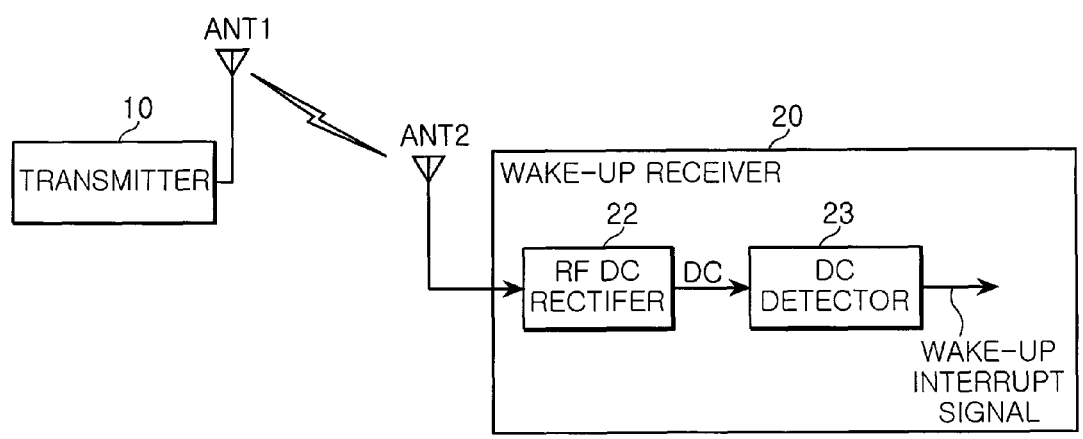
FIG. 3 is a block diagram of a wake-up receiver to which the low-power DC detector is applied according to an embodiment of the present invention.

FIG. 3 is an exemplary view of a wake-up receiver to which the low-power DC detector is applied according to an exemplary embodiment of the present invention. Referring to FIG. 3, the wake-up receiver 20 to which the DC detector 22 is applied includes an RF DC rectifier 22 receiving an RF signal from an antenna ANT1 of a transmitter 10, and a DC detector 23 detecting a DC voltage output from the RF DC rectifier 22 and detecting a wake-up interrupt signal.

Hereinafter, the operation and effect of the present invention will be described in detail with reference to the accompanying drawings.

The operation of the low-power DC detector according to the embodiment of the present invention will be described below with reference to FIGS. 1 to 3. In the low-power DC detector, the driving circuit 100 supplies the operating voltage to the ultra-low current source circuit 200 when the power supply voltage VDD is higher than the preset voltage.

The ultra-low current source circuit 200 is biased by the operating voltage supplied by the driving circuit 100, and generates the ultra-low current limited to lower than the preset current by the limitation circuit 400 to form the current mirror connection with the main current source circuit 300.

The main current source circuit 300 forms the current mirror connection with the ultra-low current source circuit 200, generates the same ultra-low current as the current of the ultra-low current source circuit 200, and supplies the generated ultra-low current to the voltage detection circuit 500 as the bias current.

In this case, the limitation circuit 400 is disposed between each of the ultra-low current source circuit 200 and the main current source circuit 300 and the ground terminal, and the limitation circuit 400 limits the current generated by the ultra-low current source circuit 200 and the main current source circuit 300 to lower than the preset current.

The voltage detection circuit 500 is biased by the ultra-low current generated by the main current source circuit 300 to detect the input DC voltage.

The respective circuits will be described in detail with reference to FIG. 1.

Referring to FIG. 1, in the case where the ultra-low current source circuit 200 includes the first current mirror 210 and the second current mirror 220, the first current mirror 210 is biased by the operating voltage supplied by the driving circuit 100 and generates the ultra-low current limited to lower than the preset current by the limitation circuit 400. In addition, the second current mirror 220 mirrors the ultra-low current generated by the first current mirror 210 to the main current source circuit 300.

In the case where the main current source circuit 300 includes the first mirror unit 310, the current mirror unit 320, and the second mirror unit 330, the first mirror unit 310 forms the current mirror connection with the second current mirror 220.

Due to the current mirror connection of the first mirror unit 310 and the second current mirror unit 220, the current mirror unit 320 formed on the same current path as the first mirror unit 310 generates the ultra-low current determined by the first mirror unit 310.

The second mirror unit 330 forms the current mirror connection with the current mirror unit 320 and generates the ultra-low current generated by the current mirror unit 320 to the voltage detection circuit 500 as the bias current.

More specifically, in the first current mirror 210 of the ultra-low current source circuit 200, the first and second PMOS transistors PM11 and PM12 form the current mirror, and the third and fourth PMOS transistors PM13 and PM14 form the current mirror. The constant current is generated by the first to fourth PMOS transistors PM11 to PM14.

Since the second current mirror 220 of the ultra-low current source circuit 200 is formed on the same current path as the first current mirror 210, it generates the same current. The first and second NMOS transistors NM11 and NM12 form the current mirror, and the third and fourth NMOS transistors NM13 and NM14 form the current mirror. Thus, the constant current is generated by the first to fourth NMOS transistors NM11 to NM14.

In this case, since the first current mirror 210 and the second current mirror 220 are formed on the same current path, they generate the same current.

In the first mirror unit 310 of the main current source circuit 300, the fifth and sixth NMOS transistors NM21 and NM22 form the current mirror in the first and second NMOS transistors NM11 and NM12 of the second current mirror 220. Also, the seventh and eighth NMOS transistors NM23 and NM24 form the current mirror in the third and fourth NMOS transistors NM13 and NM14 of the second current mirror 220. Due to the fourth to eighth NMOS transistors NM21 to NM24, the first mirror unit 310 generates the same current as the second current mirror 220.

Meanwhile, the imitation circuit 400 includes the resistor VR connected between the common connection node NC of the sources of the fourth, seventh and eighth NMOS transistors NM14, NM23 and NM24 and the ground terminal.

Therefore, the resistor VR of the limitation circuit 400 may be implemented with a variable resistor. When the resistance of the variable resistor is set, the current is limited so that the current flowing through the fourth NMOS transistor NM14, the seventh NMOS transistor NM23 and the eighth NMOS transistor NM14 becomes the ultra-low current.

Since the fifth and seventh PMOS transistors PM21 and PM23 are formed on the same current path as the fifth and seventh NMOS transistors NM21 and NM23 of the first mirror unit 310, the current mirror unit 320 of the main current source circuit 300 generates the same current as the current flowing through the fifth and seventh NMOS transistors NM21 and NM23. Also, since the sixth and eighth PMOS transistors PM22 and PM24 are formed on the same current path as the sixth and eighth NMOS transistors NM22 and NM24 of the first mirror unit 310, the current mirror unit 320 generates the same current as the current flowing through the sixth and eighth NMOS transistors NM22 and NM24.

Since the first to third driving PMOS transistors PM31 to PM33 of the first mirror circuit form the current mirror in the fifth and sixth PMOS transistors PM21 and PM22 of the current mirror unit 320, the second mirror unit 330 of the main current source circuit 300 generates the same current as the current of the current mirror unit 320. Also, since the third to sixth driving PMOS transistors PM33 to PM36 of the second mirror circuit form the current mirror in the seventh and eighth PMOS transistors PM23 and PM24 of the current mirror unit 320, the second mirror unit 330 generates the same current as the current of the current mirror unit 320.

In this way, the current generated by the second mirror unit 330 is supplied as the driving current of the voltage detection circuit 500.

On the other hand, in the case where the voltage detection circuit 500 includes the DC voltage detection unit 510 and the signal output unit 520, the DC voltage detection unit 510 is biased by the bias current output from the main current source circuit 300 to detect the input DC voltage. The signal output unit 520 buffers the voltage detected by the DC voltage detection unit 510 and outputs the buffered voltage through the output terminal.

More specifically, the first and second detection NMOS transistors NM51 and NM52 of the DC voltage detection unit 510 are turned on or off according to the input RF signal.

For example, when the RF signal is at a high level, the first detection NMOS transistor NM51 is turned on and the second detection NMOS transistor NM52 is turned off, so that the DC voltage detection unit 510 outputs a high level. On the contrary, when the RF signal is at a low level, the first detection NMOS transistor NM51 is turned off and the second detection NMOS transistor NM52 is turned on, so that the DC voltage detection unit 510 outputs a low level.

In the case where the signal output unit 520 includes the first inverter INT1 and the second inverter INT2, the first inverter INT1 is supplied with the driving current through the drain of the sixth driving PMOS transistor PM36 and inverts the signal input through the drain of the second detection NMOS transistor NM52.

The second inverter INT2 is supplied with the power supply voltage VDD and inverts the output signal of the first inverter INT1 to output the wake-up interrupt signal.

It can be seen from FIG. 2 that the RF DC rectifier according to the embodiment of the present invention consumes a low current of about 955.6 nA upon operation, so that it can operate with an ultra-low current less than 1 µA.

Referring to FIG. 3, when the DC detector 22 is applied to the wake-up receiver 20, the wake-up receiver 20 receives the RF signal from the antenna ANT1 of the transmitter 10, rectifies the received RF signal through the RF DC rectifier 22, and detects the rectified DC voltage through the DC detector 23 to output the wake-up interrupt signal.

As described above, the ultra-low current generated by the current source is used as the driving current of the detection circuit. The detection circuit detects the DC voltage to output the wake-up interrupt signal. Since the current consumption can be reduced, the DC detector of the present invention is suitable for the low-power system.

According to the embodiments of the present invention, the ultra-low current is generated and used as the bias current. Thus, the wake-up voltage of a low DC component can be detected and the current consumption can be reduced.

That is, since the DC detector operates only at a desired time, the current consumption can be minimized and the lifetime of the battery can be increased. The DC detector can be manufactured in a CMOS IC configuration and operate with the ultra-low power (<1 µA). The compatibility of the system can be increased through the RF ID tag receiver function and the system wake-up function, and additional circuits for the reference voltage of the comparator are not required.

While the present invention has been shown and described in connection with the exemplary embodiments, it will be apparent to those skilled in the art that modifications and variations can be made without departing from the spirit and scope of the invention as defined by the appended claims.

What is claimed is:

1. A low-power direct current (DC) detector, comprising:
    a main current source circuit configured to generate an ultra-low current;
    a limitation circuit configured to limit the current generated by the main current source circuit to a level lower than a preset current level;
    a voltage detection circuit biased by the ultra-low current generated by the main current source circuit and configured to detect an input DC voltage;
    a driving circuit configured to supply an operating voltage when a power supply voltage is higher than a preset voltage level; and
    an ultra-low current source circuit biased by the operating voltage supplied by the driving circuit and configured to generate the ultra-low current limited to lower than the preset current level by the limitation circuit to form a current mirror connection with the main current source circuit.

2. The low-power DC detector of claim 1, wherein the ultra-low current source circuit comprises:
    a first current minor biased by the operating voltage supplied by the driving circuit to generate the ultra-low current limited to lower than the preset current level by the limitation circuit; and a second current mirror mirroring the ultra-low current generated by the first current minor to the main current source circuit.

3. The low-power DC detector of claim 2, wherein the main current source circuit comprises:
 a first minor unit forming a current minor connection with the second current minor of the ultra-low current source circuit;
 a current mirror unit configured to generate the ultra-low current determined by the first minor unit; and
 a second minor unit forming a current minor connection with the current minor unit to supply the ultra-low current generated by the current minor unit to the voltage detection circuit as a bias current.

4. The low-power DC detector of claim 3, wherein the voltage detection circuit comprises:
 a DC voltage detection unit biased by the bias current generated by the main current source circuit to detect the input DC voltage; and
 a signal output unit buffering the voltage detected by the DC voltage detection unit to an output terminal.

5. The low-power DC detector of claim 4, wherein the first current minor comprises:
 a first PMOS transistor having a source connected to a power supply voltage terminal; and
 a second PMOS transistor having a source connected to the power supply voltage terminal, and a gate and a drain connected to a gate of the first PMOS transistor.

6. The low-power DC detector of claim 5, wherein the first current minor unit further comprises:
 a third PMOS transistor having a source connected to a drain of the first PMOS transistor, and a drain connected to the second current minor; and
 a fourth PMOS transistor having a source connected to the drain of the second PMOS transistor, and a gate and a drain connected to the gate of the second PMOS transistor.

7. The low-power DC detector of claim 6, wherein the second current mirror comprises:
 a first NMOS transistor having a drain and a gate connected to the drain of the third PMOS transistor; and
 a second NMOS transistor having a drain connected to the drain of the fourth PMOS transistor, and a gate connected to the gate and the drain of the first NMOS transistor.

8. The low-power DC detector of claim 7, wherein the second current mirror further comprises:
 a third NMOS transistor having a drain and a gate connected to a source of the first NMOS transistor, and a source connected to a ground terminal; and
 a fourth NMOS transistor having a drain connected to a source of the second NMOS transistor, a gate connected to the gate of the third NMOS transistor, and a source connected to the limitation circuit.

9. The low-power DC detector of claim 8, wherein the first minor unit comprises:
 a fifth NMOS transistor having a gate connected to the gate of the second NMOS transistor, and a drain connected to the current mirror unit; and
 a sixth NMOS transistor having a gate connected to the gate of the fifth NMOS transistor, and a drain connected to the current mirror unit.

10. The low-power DC detector of claim 9, wherein the first minor unit further comprises:
 a seventh NMOS transistor having a gate connected to the gate of the fourth NMOS transistor, a drain connected to a source of the fifth NMOS transistor, and a source connected to the limitation circuit; and
 an eighth NMOS transistor having a gate connected to the gate of the seventh NMOS transistor, a drain connected to the source of the sixth NMOS transistor, and a source connected to the limitation circuit.

11. The low-power DC detector of claim 10, wherein the imitation circuit comprises a resistor connected between a common connection node of the sources of the fourth, seventh and eighth NMOS transistors and the ground terminal.

12. The low-power DC detector of claim 11, wherein the resistor of the limitation circuit is a variable resistor.

13. The low-power DC detector of claim 10, wherein the current minor unit comprises:
 a fifth PMOS transistor having a source connected to the power supply voltage terminal;
 a sixth PMOS transistor having a source connected to the power supply voltage terminal, and a gate connected to a gate and a drain of the fifth PMOS transistor;
 a seventh PMOS transistor having a source connected to the drain and the gate of the fifth PMOS transistor, and a drain and a gate connected to the drain of the fifth NMOS transistor; and
 an eighth PMOS transistor having a source connected to the drain of the sixth PMOS transistor, a gate connected to the drain and the gate of the seventh NMOS transistor, and a drain connected to the drain of the sixth NMOS transistor.

14. The low-power DC detector of claim 13, wherein the second mirror unit comprises:
 a first minor circuit including first to third driving PMOS transistors having gates connected to the gate of the sixth NMOS transistor, and sources connected to the power supply voltage terminal; and
 a second mirror circuit including fourth to sixth driving PMOS transistors having gates connected to the gate of the eighth NMOS transistor, and sources respectively connected to the drains of the first to third driving PMOS transistors.

15. The low-power DC detector of claim 14, wherein the DC voltage detection unit comprises:
 a first detection NMOS transistor having a gate connected to an input terminal to receive the DC voltage, a drain connected to a drain of the fourth driving transistor, and a source connected to the ground terminal; and
 a second detection NMOS transistor having a drain connected to a drain of the fifth driving transistor, a gate connected to the drain of the first detection NMOS transistor, and a source connected to the ground terminal.

16. The low-power DC detector of claim 15, wherein the signal output unit comprises a first inverter receiving a driving current through a drain of the sixth driving PMOS transistor and inverting a signal input through the drain of the second detection NMOS transistor.

17. The low-power DC detector of claim 16, wherein the signal output unit further comprises a second inverter receiving the power supply voltage and inverting a signal output from the first inverter.

18. The low-power DC detector of claim 2, wherein the first current minor comprises:
 a first PMOS transistor having a source connected to a power supply voltage terminal; and a second PMOS transistor having a source connected to the power supply voltage terminal, and a gate and a drain connected to a gate of the first PMOS transistor.

19. The low-power DC detector of claim 18, wherein the first current minor unit further comprises:

a third PMOS transistor having a source connected to a drain of the first PMOS transistor, and a drain connected to the second current minor; and a fourth PMOS transistor having a source connected to the drain of the second PMOS transistor, and a gate and a drain connected to the gate of the second PMOS transistor.

20. The low-power DC detector of claim 1, wherein the imitation circuit comprises a variable resistor.

* * * * *